(12) United States Patent
Markle

(10) Patent No.: US 6,731,376 B1
(45) Date of Patent: May 4, 2004

(54) SYSTEM AND METHOD FOR REDUCING COLINEARITY EFFECTS IN MANUFACTURING MICRODEVICES

(75) Inventor: David A. Markle, Saratoga, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 10/035,764

(22) Filed: Oct. 22, 2001

Related U.S. Application Data

(63) Continuation-in-part of application No. 09/854,226, filed on May 10, 2001.

(51) Int. Cl.$^7$ .................. G03B 27/72; G03B 27/42; G03B 27/32; B03F 9/00; A61N 5/00
(52) U.S. Cl. .................. 355/69; 355/53; 355/67; 355/72; 355/77; 430/22; 430/30; 430/311; 430/312; 250/492.2; 250/492.22; 250/548
(58) Field of Search .................. 355/53, 69, 67, 355/72, 77; 430/22, 30, 311, 312; 250/492.2, 492.22, 548

(56) References Cited

U.S. PATENT DOCUMENTS

| | | | |
|---|---|---|---|
| 5,523,193 A | * | 6/1996 | Nelson |
| 5,699,621 A | | 12/1997 | Trumper ............... 33/1 M |
| 5,749,769 A | | 5/1998 | Church et al. ............ 451/5 |
| 6,191,843 B1 | * | 2/2001 | Takiguchi |
| 6,399,261 B1 | * | 6/2002 | Sandstrom |

OTHER PUBLICATIONS

M. E. Williams et al., *Magnetic Levitation Scanning Stages for Extreme Ultraviolet Lithography*, ASPE 14$^{th}$ annual meeting, Monterey CA., Nov. 1999.

* cited by examiner

Primary Examiner—Frank G. Font
Assistant Examiner—Khaled Brown
(74) Attorney, Agent, or Firm—Allston L. Jones

(57) ABSTRACT

Systems and methods for reducing colinearity effects in the formation of microdevices are disclosed. A mask with at least one column of microdevice cells is illuminated with pulses of radiation such that only a single column is illuminated. Images of the column are used to form adjacent columnar exposure fields on a workpiece. The columnar exposure fields so formed each have a width much less than that of the full exposure field capable of being formed by the projection lens. One method of the invention includes forming each columnar exposure field with a single pulse of radiation while the workpiece moves continuously relative to a projection lens and mask. Another method includes forming each columnar exposure field with a burst of radiation pulses or a long continuous pulse while stepping the workpiece beneath a projection lens between bursts. By forming columnar exposure fields that contain a single row of devices, a substantial number of error sources that contribute to co-linearity error are eliminated. This improves the control over a critical thin film head device parameter called throat length and results in a higher yield of higher performance devices. Among the errors that are eliminated with this method are pattern placement errors on the mask, distortion in the projection lens and pattern butting errors caused by rotational errors between the projected mask pattern and the previously defined wafer patterns.

27 Claims, 10 Drawing Sheets

SYSTEM AND METHOD FOR REDUCING COLINEARITY EFFECTS IN MANUFACTURING MICRODEVICES

CROSS REFERENCE

This application is a continuation-in-part of Ser. No. 09/854,226, filed May 10, 2001, entitled "Lithography System And Method for Device Manufacture".

BACKGROUND OF THE INVENTION

1. Field of the Invention

The present invention relates to microdevice manufacturing and in particular relates to systems and methods of manufacturing microdevices in a manner that reduces co-linearity effects.

2. Description of the Prior Art

Microdevices are miniature apparatus that perform a specific function on a small scale (typically 1 mm or less). Examples of microdevices are micro-electro-mechanical devices (MEMS), digital mirror devices (DMDs), ink jet arrays and thin-film magnetic read/write heads used in magnetic recording systems for data storage.

In magnetic disk drive systems, data is read from and written onto the recording media utilizing a thin-film read/write head. Typically, one or more recording disks are mounted on a spindle such that the disks can rotate and a read/write head is mounted on a movable arm to be positioned closely adjacent the rotating disk surface of each disk to read or write information thereon.

During operation of the disk drive system, an actuator mechanism moves the read/write head to a desired radial position on the surface of the rotating disk where the magnetic head reads or writes data. The head is fabricated on a block material referred to as a "slider." Typically, a slider is formed with an aerodynamically shaped surface that is mounted parallel to the recording disk surface, and forms an air-bearing surface (ABS) during operation. The magnetic head device is contained on a surface normal to the ABS surface and at the trailing end on the slider where the gap between the slider and the recording media is a minimum.

The manufacture of microdevices such as thin-film read/write heads involves the use of lithographic techniques very much like those used to fabricate integrated circuits (ICs) on a semiconductor substrate (wafer). Presently, steppers and scanners with wavelengths ranging from the mercury i-line to 248 nm to 193 nm are used. By way of example, thin-film magnetic read/write heads are typically formed as a two-dimensional array of device units on a ceramic wafer. After wafer-level processing of the device units is complete, the substrate is then sliced into row-bars, with each bar comprising a row of unfinished slider units. One of the sliced edges of each row-bar is then lapped to form a smooth surface, which precisely intersects the magnetic throat of each head on the row bar.

With reference to FIG. 1A, there is shown a cross-sectional view of an inductive thin-film head having a top pole 2A and a bottom pole 2B separated by an insulating region 3. Write coils 4 pass through insulation region 3 and carry a current that induces a magnetic flux, F, in poles 2A and 2B. Poles 2A and 2B come together to form a throat 5 with an end 6 that scans over a magnetic media 7.

With reference now to FIG. 1B, when throat 5 is too long, the magnetic flux leaks out between the extended poles through insulation layer 3, which weakens the flux available for writing in magnetic medium 7. On the other hand, with reference to FIG. 1C, when throat 5 is too short, the air path between end 6 and magnetic medium 7 is large and presents a high resistance that weakens the magnetic flux at the write plane. Thus, the throat length is a critical dimension in the functionality of a thin-film head.

With the assistance of electrical test structures, which are located next to the heads, it is possible to hold much tighter tolerances on the throat position (and thus throat length) using lapping than would be possible using lithography. However the result of the lapping depends upon the colinearity of the images that determine the throat position, since the lapping operation produces a straight edge that cuts across the row of devices. Thus any randomness in the position of the devices inevitably results in an error in the position of the throat and thus an undesirable degradation in device performance. Optional subsequent steps may form features on the lapped surface such as the air bearing surface using a plasma etching processes.

After the ABS processing is completed, the row-bar is then further diced into s individual sliders, each slider having at least one optical or magnetic head terminating at the slider ABS.

As the dimensions of thin-film read/write head devices continue to shrink, the allowable co-linearity error also shrinks. The lapping operation can be controlled very accurately, but randomness in the position of each device on the wafer limits the performance and yield of the devices. This randomness in position is primarily the result of the properties of the particular lithography system used to fabricate the device. The main error contributors include pattern placement errors on the mask, distortion in the imaging lens, and stitching errors.

With regard to stitching errors, the field size of a lithography tool is usually about half the length of a typical row-bar, so that two or more exposure fields (each of which contains a two-dimensional array of microdevices) must be stitched together. Stitching errors include overall placement variations in each field (stepping errors) as well as any rotation errors between the mask pattern and wafer pattern. The net result is an unavoidably large error budget for the position of the devices in a row-bar measured normal to the lapped surface. These errors are typically on the order of 30 to 50 nm and are referred to as "co-linearity errors." Co-linearity errors determine the most critical performance properties of the thin film head device.

Though co-linearity errors have been described with respect to thin-film read/write head devices, these errors are generally present in the fabrication of microdevices where exposure fields must be stitched together to form a complete device, or where another operation such as lapping must be performed on a number of device fields. Reducing co-linearity errors in the fabrication of microdevices results in higher yields and better device performance.

SUMMARY OF THE INVENTION

The present invention relates to microdevice manufacturing, and in particular relates to systems and methods of manufacturing microdevices in a manner that reduces co-linearity effects.

In particular, the present invention is a method of printing the critical levels of a microdevice, such as a thin-film read/write head. The method includes using a mask having at least one column of microdevice patterns. Only one of the columns need be illuminated. An accurate stage is used to move the workpiece normal to the direction of the column before printing the next column and subsequent columns.

Reducing the number of columns to be printed per exposure to a single column minimizes position variations in the column direction of a row of devices (e.g., a row-bar) that cuts across all columns. By positioning a row-bar across such a row, the microdevices are positioned very repeatedly in the column direction and the subsequent lapping operation can optimally control a critical device parameter, i.e., throat height.

Accordingly, a first aspect of the invention is a method of fabricating microdevices from a workpiece. The method includes the steps of illuminating a single column of microdevice cells on a mask with pulses of radiation. This may be achieved by providing a mask with a single column of microdevice cells, or by illuminating a single column of a mask having many columns of microdevice cells. The method also includes the step of patterning the workpiece with images of the illuminated single column to form corresponding adjacent columnar exposure fields by continuously moving the substrate in the direction perpendicular to the long axis of the columnar exposure fields during illumination of the mask so that each columnar exposure field is formed by a single pulse of radiation.

A second aspect of the invention is a system for patterning a workpiece to form microdevices in a manner that reduces colinearity effects. The system includes a radiation source for providing pulses of radiation and a radiation source controller in operation communication with the radiation source for controlling the emission of the radiation pulses from the radiation source. An illuminator arranged to receive pulses of radiation from the radiation source and illuminate a single column of microdevice cells on a mask. A projection lens is arranged to receive pulses of radiation passing through the mask and is adapted to form a columnar exposure field of microdevice units that corresponds to the column of microdevice cells on the mask. The system also includes a workpiece stage capable of supporting the workpiece and moving the workpiece over a scan path relative to the projection lens and in a direction normal to the projected direction of the column on the workpiece. A workpiece stage position control unit is in operable communication with the workpiece stage and in communication with the radiation source control unit. The workpiece stage position control unit controls the movement of the workpiece stage over the scan path such that a single pulse of radiation forms a single columnar exposure field, with temporally adjacent radiation pulses forming adjacent columnar exposure fields.

DETAILED DESCRIPTION OF THE INVENTION

The present invention relates to microdevice manufacturing, and in particular relates to systems and methods of manufacturing microdevices in a manner that reduces co-linearity errors.

The present invention is directed to patterning a workpiece to form the critical levels of a microdevice, such as a thin-film head. Exemplary methods for the post-processing of microdevices once the critical levels are formed using the systems and methods of the present invention are described in U.S. Pat. No. 5,749,769 (hereinafter referred to as '769 Patent), notice of which will increase the understanding of the present invention.

Figure 1A:
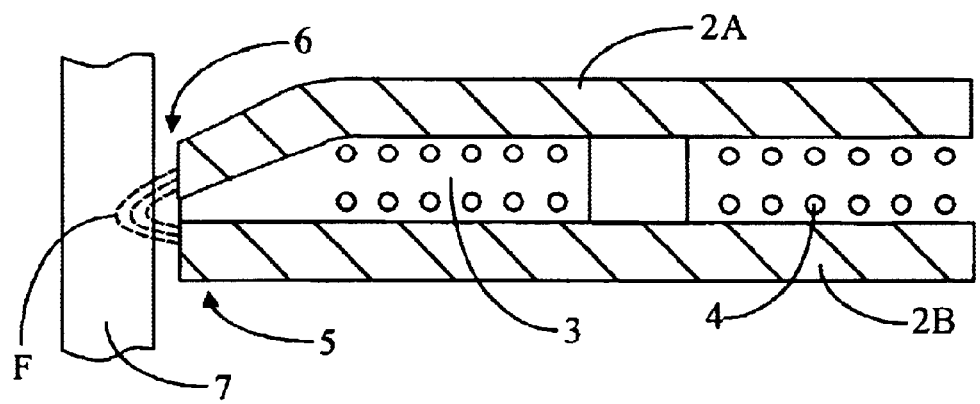
FIGS. 1A–1C are cross-sectional schematic diagrams of a thin film head showing a normal throat length (FIG. 1A), a throat length that is too long (FIG. 1B) and a throat length that is too short (FIG. 1C)
Figure 1B:
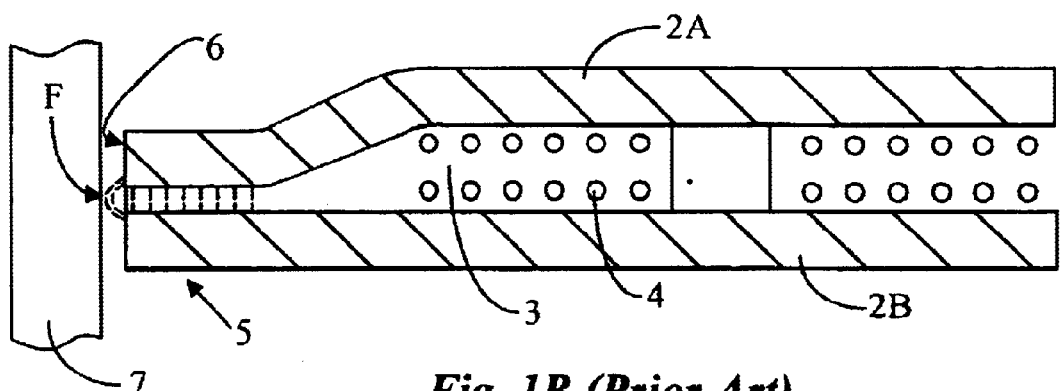
Figure 1C:
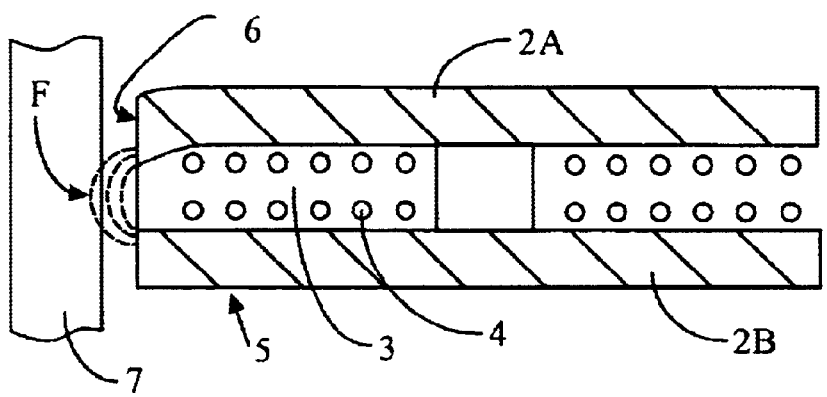
Figure 2:
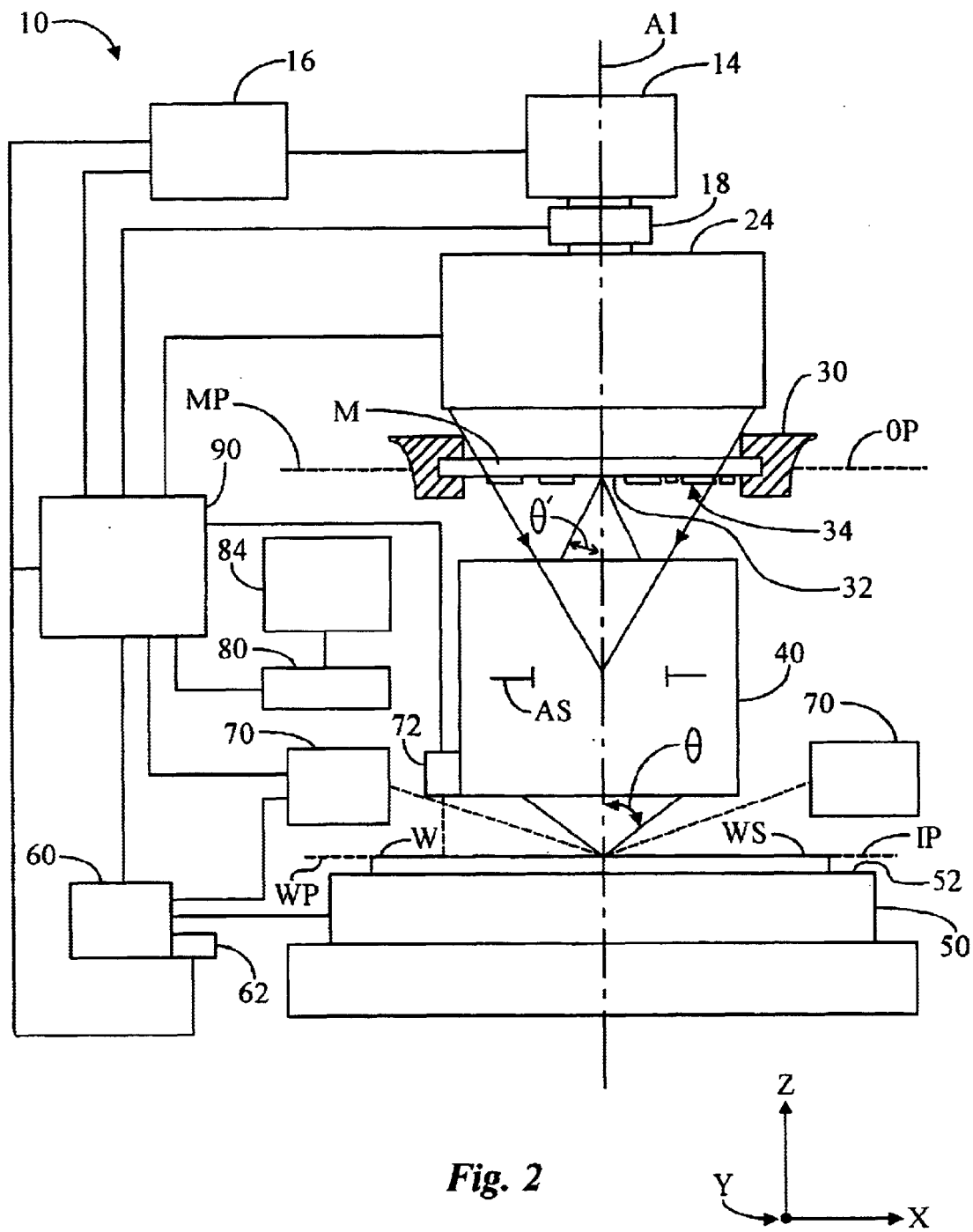
FIG. 2 is a schematic diagram of a lithography system for carrying out the method of the present invention.

With reference now to FIG. 2, there is shown a lithography system 10 suitable for use in carrying out the present invention. System 10 is also referred to herein by its trademarked name, the CONTINUOUS LITHOGRAPHY™ lithography system, as used by the present assignee. System 10 is described in great detail in U.S. patent application Ser. No. 09/854,226, filed on May 10, 2001 that is the parent application of the present application and owned by the same assignee as that of the present application. That application is entitled "Lithography System And Method For Device Manufacture"from which application the present application is a continuation-in-part application, and that earlier filed Patent Application is incorporated by reference herein in its entirety. A description of lithography system 10, as well as the method of utilizing assignee's CONTINUOUS LITHOGRAPHY™ exposure mode with the system for producing microdevices in a manner that reduces colinearity effects is provided below.

Lithography system 10 of the present invention includes, in order along an optical axis A1, a radiation source 14 electrically connected to a radiation source controller 16. In the present invention, the term "radiation source" is used to generically describe a source for emitting radiation, which includes wavelengths ranging from the visible to the soft x-ray. The radiation source can be a continuous source such as a mercury lamp, which is shuttered or otherwise modulated to determine the correct exposure dose, or a pulsed source of radiation such as an excimer laser. In the case of a pulsed source, one or more pulses may be used for a single exposure. Optionally included adjacent radiation source 14 is a pulse stabilization system 18 for providing pulse-to-pulse uniformity of the radiation pulses emitted from the radiation source in the case where the radiation source pulse-to-pulse stability needs to be improved.

Further included in system 10 along axis A1 is an illumination system 24 with an adjustable field stop FS and other elements 25, and a mask holder 30 capable of supporting a mask M at a mask plane MP. Field stop FS is arranged conjugate to mask plane MP and is adjustable to define the area of illumination of mask M at mask plane MP. This area of illumination is referred to herein as illumination field IF.

In most lithography systems, illumination field IF has a maximum width that extends to the limits of the patterned area of the mask and is arranged to utilize the entire projection lens field i.e., perform a full-field exposure. In an exemplary embodiment, illuminator elements 25 can be added, removed or rearranged to change the size of illumination field IF without a substantial loss in the total amount of energy for exposure while also maintaining the image quality and proper illumination. Not all types of illumination source are amenable to being concentrated into a smaller illumination area so this option applies primarily to certain laser sources. Reducing the size of illumination field IF at the mask plane can be accomplished by adjusting the field stop FS, by rearranging elements 25 in the illumination system, or by adjusting both. An advantage of adjusting the illumination field size by adjusting the illuminator elements 25 (assuming this is permitted by the nature of radiation source 14) is that it allows for the more efficient use of radiation from the radiation source.

With continuing reference to FIG. 2, mask M includes a top surface 31 and a bottom surface 32 that includes a pattern 34. Pattern 34 may be binary (e.g., a chrome pattern on clear glass), or a phase mask (e.g., phase changes generated by a patterned phase-inducing dielectric material), or a combination of the two. Mask M is typically fused silica or other suitable material transparent to the wavelength of radiation from radiation source 14, except where mask M is a reflective mask and the substrate material transmittance is of no consequence. In the case where system 10 employs EUV radiation, mask M is reflective, and system 10 is folded accordingly. A binary reflective mask is created by forming a reflective layer atop a substrate and then forming a pattern atop the reflective layer using an absorber layer. Exemplary reflective masks suitable for use with the present invention are described in greater detail below.

System 10 also includes a projection lens 40 having an object plane OP arranged substantially coincident with mask plane MP, an aperture stop AS and an image plane IP. A workpiece stage 50 is arranged adjacent projection lens 40 at or near image plane IP and has an upper surface 52 capable of supporting a workpiece W having an image-bearing surface WS. In a preferred embodiment of the present invention, workpiece W is a semiconductor wafer, and upper surface WS is an image-bearing a surface comprising a layer of photoresist. Workpiece W is preferably pre-processed according to the nature of the microdevice being formed. For example, where the microdevices to be formed are magnetic read/write heads, workpiece W is preferably made of $Al_2O_3$—TiC covered with a thin layer of alumina.

With continuing reference to FIG. 2, electrically connected to workpiece stage 50 is a workpiece stage position control system 60, which includes a metrology device 62 for accurately measuring the workpiece stage position. Metrology device 62 is electrically connected directly to radiation source controller 16 so that the motion of workpiece stage 50 and the activation of radiation source 14 can be coordinated. Stage position control system 60 is capable of positioning workpiece W with high precision relative to the mask image or other reference, such as projection lens 40.

Workpiece stage 50 preferably has movement capability in all 6 degrees of freedom. Existing air-bearing and magnetic levitation ("maglev") workpiece stages and stage position control systems are capable of providing such movement, as well as high scan speeds (e.g., in excess of 100 mm/s) and are thus suitable for use with the present invention. Exemplary workpiece stages 50 are described in U.S. Pat. No. 5,699,621, and in the article by M. E. Williams, P. Faill, S. P. Tracy, P. Bischoff, and J. Wronosky, Entitled *Magnetic Leviation Scanning Stages For Extreme Ultraviolet Lithography*, ASPE $14^{th}$ annual meeting, Monterey Cailf., November 1999.

The ability of workpiece stage 50 to move in the X- and Y-planes and rotate about the Z-axis is necessary for properly positioning mask images on image-bearing surface WS of workpiece W. Z-axis movement capability, along with angular adjustment capability about the X- and Y-axis (pitch and roll), is necessary for keeping the workpiece surface within the shallow depth of focus of projection lens 40. The Z-position of the image-bearing surface WS (which is also the focal surface) of workpiece W can vary between exposure fields if the workpiece is not perfectly flat. Similarly, small rotations about the X- and Y-axis can also occur. Accordingly, metrology device 62, which in an example embodiment is an interferometer, is preferably included as part of stage position control system 60 for accurately measuring the coordinates of workpiece stage 50 relative to projection lens 40, and for providing this positioning information to radiation source control system 16.

With continuing reference to FIG. 2, a focus system 70 is arranged (e.g., adjacent projection lens 40, as shown) in operative communication with workpiece W and senses the position of image-bearing surface WS of the work piece with respect to projection lens 40. Focus system 70 generates electrical signals, which are sent to control system 60 and result in stage 50 adjusting the axial (Z) position and pitch and roll orientation of the workpiece.

System 10 further includes an alignment system 72 arranged in optical communication with workpiece W for aligning the workpiece with respect to a reference (e.g., the image of a mask alignment key imaged on the workpiece by projection lens 40). A workpiece handling system 80 in operable communication with workpiece stage 50 is provided for transporting workpieces between the workpiece stage and a workpiece storage unit 84. A system controller 90 is electronically connected to radiation source controller 16, pulse stabilization system 18, illumination system 24, workpiece stage position control system 60, focus system 70, alignment system 72 and workpiece handling system 80, and controls and coordinates the operation of these systems.

Figure 3A:
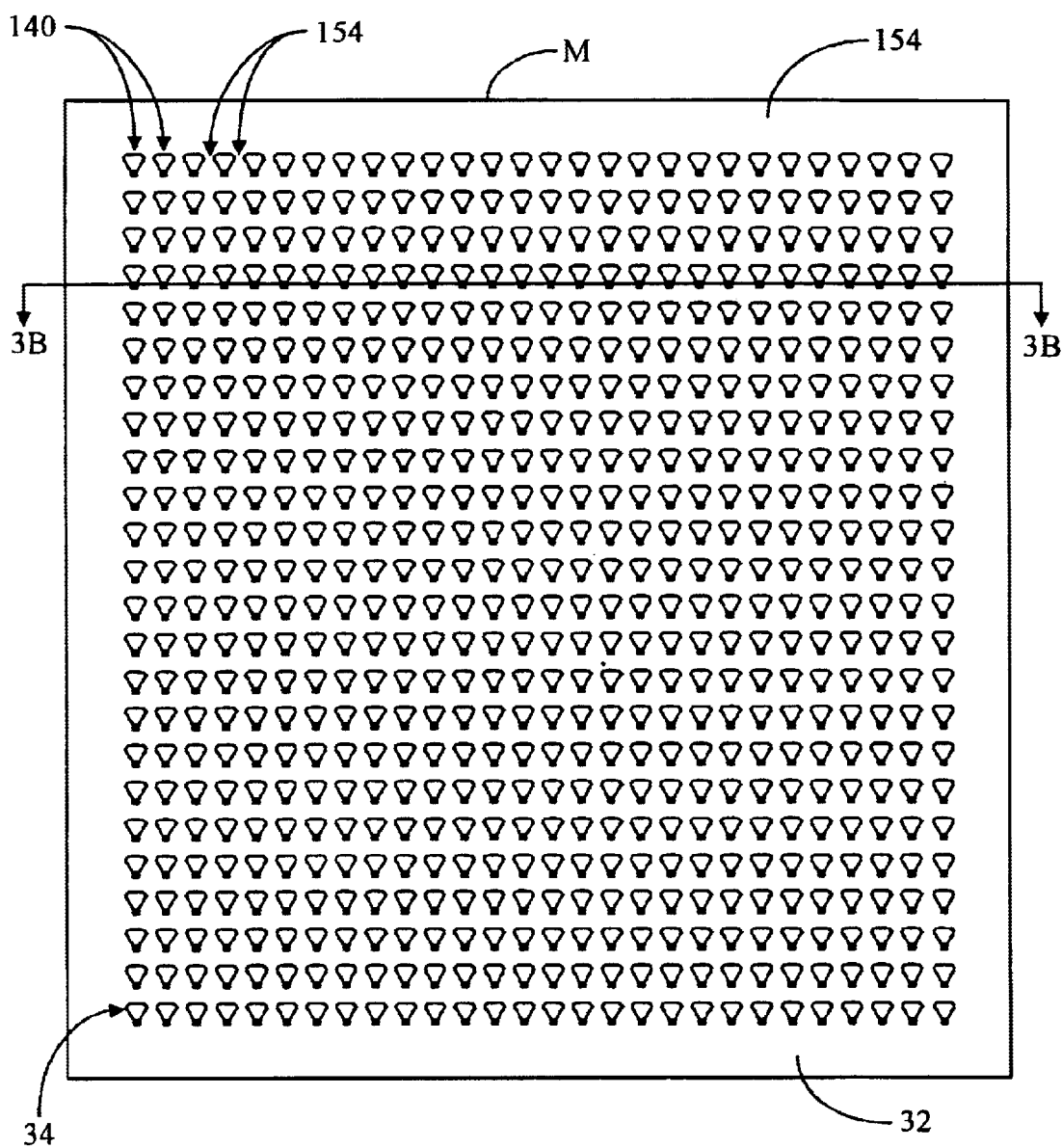
FIG. 3A is a bottom-up plan view of an exemplary embodiment of a mask suitable for use in the present invention for fabricating microdevices, the mask including a plurality of columns each comprising a plurality of microdevice cells.
Figure 3B:
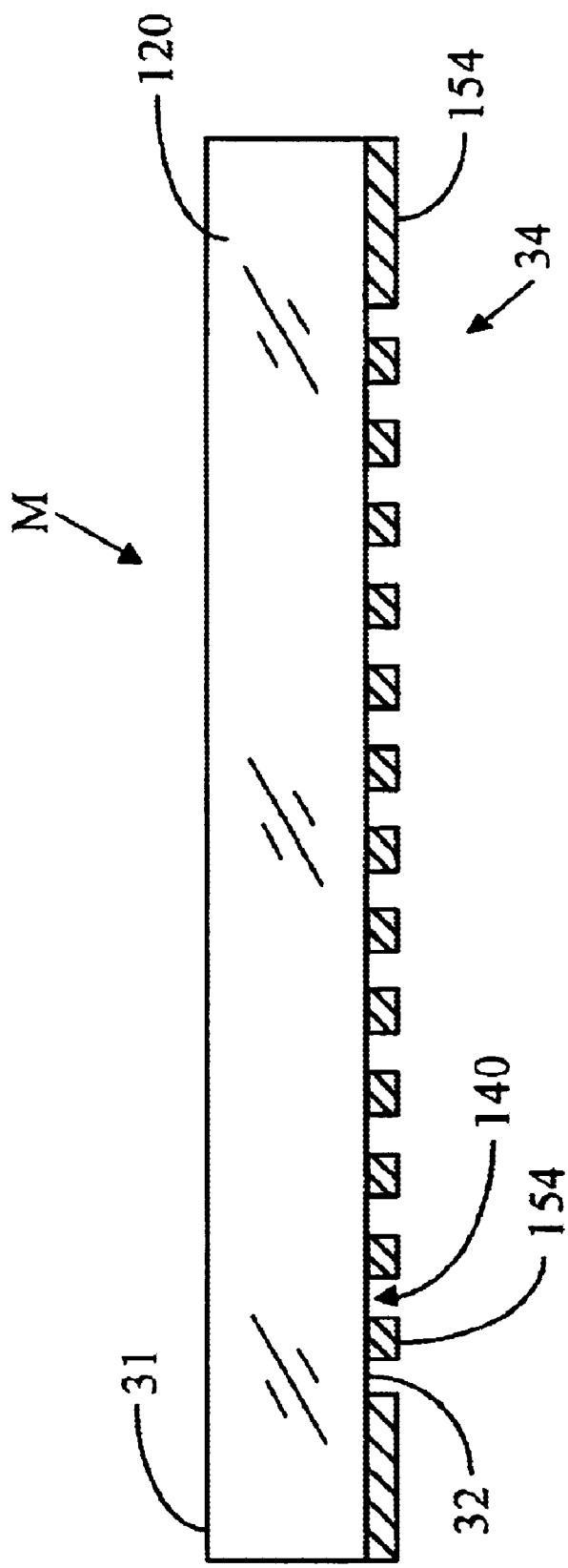
FIG. 3B is a cross-sectional view of the mask of FIG. 3A taken along the line 3B—3B.
Figure 3C:
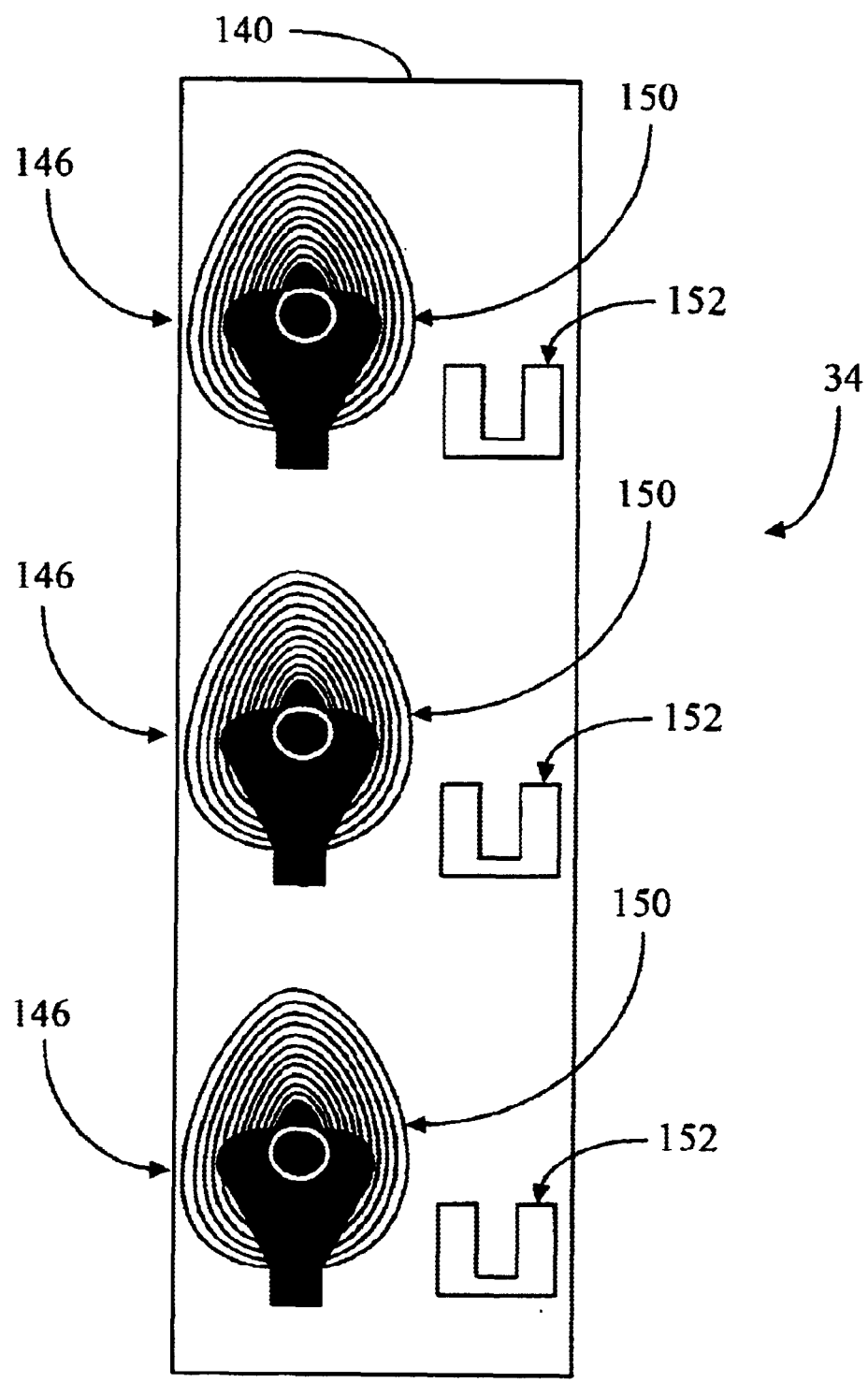
FIG. 3C is a close-up view of a microdevice column showing the columnar arrangement microdevice cells with exemplary patterns formed in each cell.

With reference now to FIGS. 3A–3D, there is shown an exemplary mask M for use in the present invention. Mask M comprises a transparent mask blank 120 (FIG. 3B) with top surface 31 and bottom surface 32. Mask M, in one exemplary embodiment, includes as part of pattern 34 a plurality of columns 140 of microdevice cells 146 (FIG. 3C). Microdevice cells include, in an exemplary embodiment, microdevice patterns 150 (FIG. 3C) that correspond to the critical level features of the microdevices to be formed. Also optionally included in microdevice cells 146 are electrical test device structures 152 (FIG. 3C), preferably formed adjacent every device pattern, to assist in performing the lapping operation, e.g., in defining the throat position (i.e., through length) of a read/write head. In the example embodiment, electrical test device structures 152 are located in a kerf region (not shown) between microdevice cells 146.

With reference to FIGS. 3B and 3C, columns 140 are defined, in one example, by an opaque layer 154. When used to form microdevices such as thin-film magnetic read/write heads with a projection lens 40, columns 140 might include anywhere from 10 to 30 microdevice cells 146, and have microdevice patterns with critical dimensions from about 1 micron to less than a quarter micron. In an exemplary embodiment of the present invention, the width-to-length aspect ratio of column 140 is from about 1:10 to about 1:50. Also, if negative photoresist is used as the image-bearing surface WS, then the polarity of mask M changes (i.e., transparent becomes opaque and vice versa).

Figure 3D:
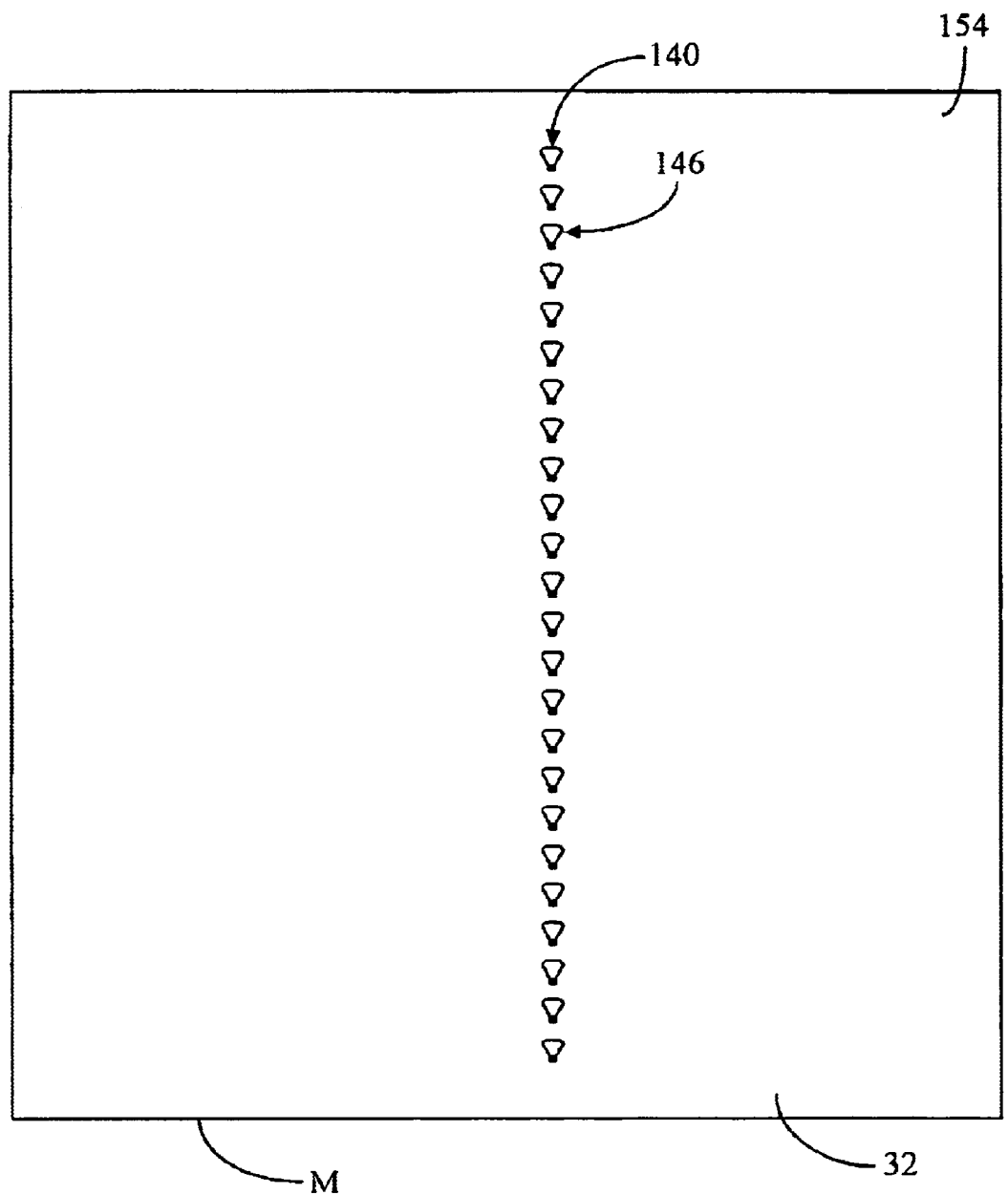
FIG. 3D is a bottom-up plan view of an exemplary embodiment of a mask suitable for use in the present invention similar to that of FIG. 3A including only a single column of microdevice cells.

With reference now to FIG. 3D, there is shown another exemplary mask M for use in the present invention. Mask M of FIG. 3D is similar to that of FIG. 3A, except that it includes only a single column 140 of microdevice cells 146 (FIG. 3C). Use of the masks M illustrated in FIGS. 3A and 3D in the present invention is discussed immediately below.

Method of Operation

The method of the present invention is now described with reference to the flow diagram 300 of FIG. 4, and with reference also to FIG. 2.

A key aspect of the present invention involves repeatedly illuminating a single column 140 on mask M to form corresponding array of columnar exposure fields on the workpiece. This approach results in only a portion the available projection lens field being used, which eliminates co-linearity errors due to the projection lens distortion. Printing single columns also reduces field-stitching errors that arise when multiple columns are printed simultaneously over a large exposure field since field stitching errors caused by small angular errors between the orientation of the mask image and the wafer stepping direction do not, in this case, contribute to co-linearity errors. Similarly, placement errors from device to device on the mask, in this case, do not contribute to co-linearity errors.

Figure 4:
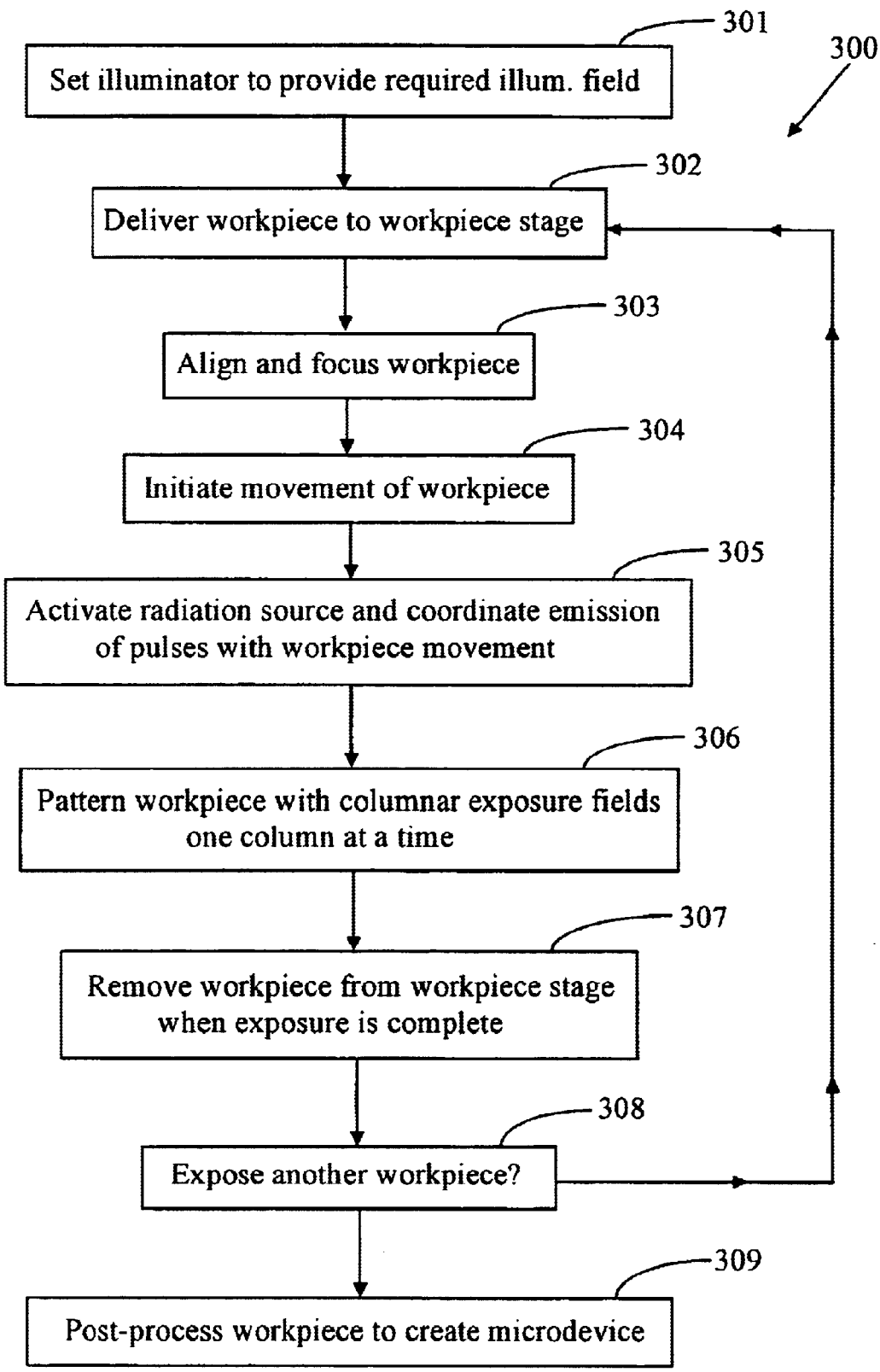
FIG. 4 is a flow diagram of the methods of fabricating a microdevice according to the present invention.

Referring to step 301 in FIG. 4, system controller 90 (FIG. 2) sends an electrical signal to illumination system 24 to set the size of the illumination field IF, which depends on the type of mask M used. If the multi-column "two-dimensional" mask M of FIG. 3A is used, then illumination system 24 needs to be set so that only a single column 140 is illuminated. This can be accomplished by adjusting field stop FS, adjusting the internal illumination elements 25, or adjusting both.

On the other hand, if the single-column (1-D) mask M of FIG. 3D is used, the field stop FS and/or illuminator elements 25 can be set so that the illumination can cover an area at mask plane MP greater than that of single column 140. This latter arrangement may be preferred for the sake of simplicity, even though it may not use the radiation as efficiently as tailoring the illumination field to fit a single column 140.

Next, in step 302 if there is no workpiece W present on workpiece stage 50, system controller 90 sends an electronic signal to workpiece handling system 80 to initiate the delivery of a workpiece from workpiece storage unit 84 to upper surface 52 of workpiece stage 50.

Once workpiece W is placed on workpiece stage 50, then in step 303 system controller 90 sends electronic signals to focus system 70 and alignment system 72 to initiate focus and alignment of workpiece W with respect to projection lens 40. Focus system 70 is used to position workpiece W at the best focus position of projection lens 40 via system controller 90 sending an electrical signal to stage position control system 60. Alignment system 72 measures the alignment state of workpiece W by, in one example, imaging and analyzing the position of alignment marks (not shown) formed on the workpiece and executing a calibration procedure that measures the offset between the alignment system axis and the position on the workpiece of the projected image of the alignment marks.

This alignment information is sent via an electronic signal to system controller 90. System controller 90 in turn sends an electronic signal to stage position control system 60, which positions the workpiece so as to be property aligned with respect to projection lens 40 and placed at the best focus (or at least to within the depth of focus) of the projection lens. This focus and alignment process typically requires iterative movements of workpiece W to measure the alignment positions at different points across the workpiece W and to level the workpiece with respect to the projection lens focal plane and thus achieve the optimal workpiece position. The alignment step is generally carried out so that the columnar mask image contained in the image field of the projection lens will be aligned to columnar exposure fields previously exposed onto to workpiece W. As mentioned above, because each exposure field is a relatively thin column, adjustments to alignment and focus can be performed more often and on a shorter distance scale, thereby further reducing co-linearity errors that are commonly associated with simultaneously printing multiple columns with relatively large exposure (or equivalently, projection lens) fields.

Once workpiece W is property aligned and focused, then in step 304 system controller 90 sends an electrical signal to stage position control system 60 to initiate the movement of workpiece stage 50 underneath projection lens 40.

In conjunction with step 304, in step 305 system controller 90 sends an electronic signal to radiation source controller 16, which activates radiation source 14 via an electronic signal, whereupon radiation source 14 provides a dose of radiation having a predetermined amount of energy along axis A1. The emission of radiation, which can be in the form of one or more short pulses from a laser or a long pulse generated by shuttering or otherwise modulating a continuous radiation source such as a mercury lamp or continuous-wave laser, is coordinated with the movement of workpiece stage 50 and thus workpiece W. The radiation from radiation source 14 passes through illumination system 24, which uniformly illuminates mask M over illumination field IF, encompasses a single column 140. Radiation passing through and diffracted by column 140 and microdevice cells 146 therein is collected by projection lens 40.

Step 305 optionally includes stabilizing the pulse-to-pulse uniformity of radiation source 14 via pulse stabilization system 18.

Figure 5A:
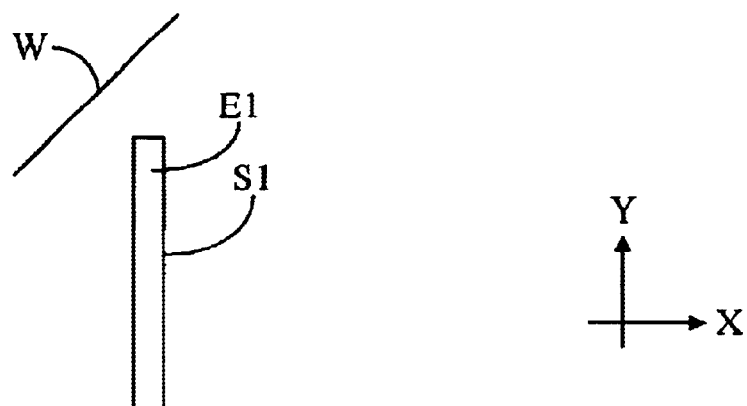
FIG. 5A is a close-up plan view of a workpiece showing a first columnar exposure field after performing a first exposure by illuminating a single column of microdevice cells on the mask using the system of FIG. 2.
Figure 5B:
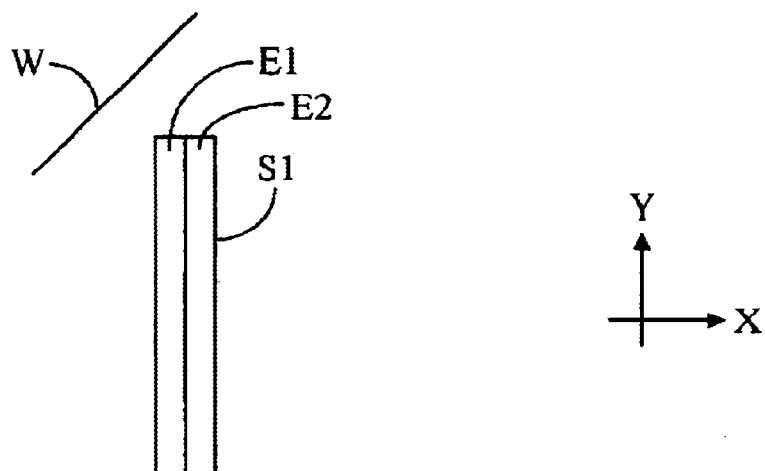
FIG. 5B is a close-up plan view similar to that of FIG. 5A, showing two adjacent exposure fields after performing a second exposure by illuminating the single column of microdevice cells.
Figure 5C:
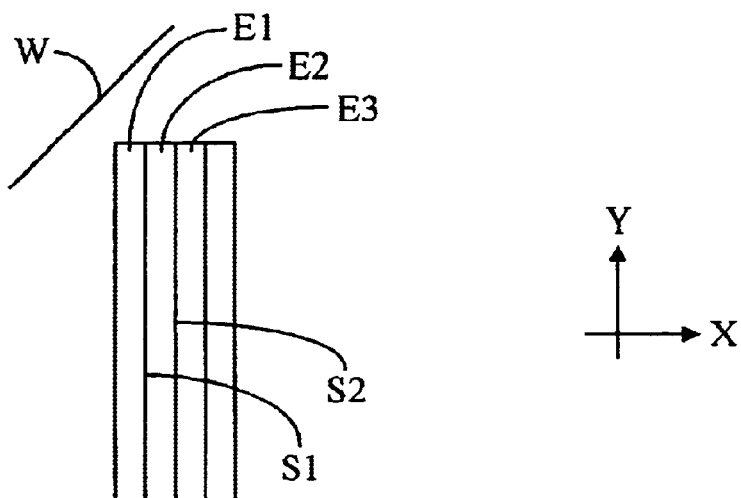
FIG. 5C is a plan view similar to that of FIG. 5B, showing three adjacent exposure fields after performing a third exposure by illuminating the single column of microdevice cells.

With reference now also to FIGS. 5A–5C, in step 306 workpiece W is patterned with a plurality of columnar exposure fields EF (FIG. 6), one columnar exposure field at a time. Exposure fields EF as shown in FIGS. 5A–5C (E1, E2, E3) are drawn with an aspect ratio of about 1:22. This represents an example exposure field dimension of 1 mm×22 mm that might be formed by imaging a microdevice column 140 of dimension 1 mm×22 mm with a 1:1 projection lens having an overall lens field size of 22 mm×22 mm. In a preferred embodiment of the invention, the width of columnar exposure fields EF is—about 10% or less than that capable of being formed by projection lens 40.

Patterning of workpiece W is accomplished by imaging the radiation collected by projection lens 40 onto the workpiece to form a first exposure field E1 at a predetermined location as previously determined by alignment system 72. Exposure field E1 may be formed in juxtaposed registration over a pre-exposed exposure field (not shown) formed in image-bearing surface WS of workpiece W. Exposure field E1 is columnar with a side S1 and corresponds to single column 140 on mask M. For applications involving the exposure of deep UV photoresist, the energy in each pulse from radiation source 14 is preferably in the range of 5 to 50 mJ/cm$^2$.

Radiation source controller 16 controls the exposure dose from radiation source 14. The workpiece position during exposure is based on information received from metrology device 62. Workpiece stage positioning system 60 controls the position of the workpiece during exposure. Exposure can be done while the workpiece is stationary, i.e. a step-and-scan mode of operation, or with a single short burst of radiation while the workpiece is scanned in a "CONTINUOUS LITHOGRAPHY™ mode of operation.".

CONTINUOUS LITHOGRAPHY™ Exposure Mode

An exemplary embodiment of the present invention involves operating in the CONTINUOUS LITHOGRAPHY™ exposure mode, wherein the movement of workpiece stage 50 is continuous and each exposure field EF is formed with a single pulse of radiation. The continuous motion of the workpiece beneath projection lens 40 during each radiation pulse, as well as during the time between radiation pulses, results in the formation of separate (i.e., non-overlapping) adjacent exposure fields EF each formed by a single radiation pulse. Each exposure field EF is essentially the size of single column 140 times the demagnification of projection lens 40. Thus, sequential (i.e., temporally adjacent) radiation pulses correspond to sequential (i.e., spatially adjacent) exposure fields formed on the workpiece.

Because exposure fields EF are columnar and significantly narrower than the width of a typical full exposure field (e.g., ~1 mm vs. ~22 mm), the amount of movement in the x-direction necessary to print adjacent exposure fields is very small. In an exemplary embodiment of the invention, column 140 on mask M has a width that is 10% or less of the width available to be exposed when illuminating the entire patterned area on mask M in performing a full-field exposure. Thus, even with a modest scan speed (e.g., 200 mm/s), a fairly high pulse rate (e.g., 200 Hz) for radiation source 14 can be used.

In this fashion, workpiece W is moved beneath projection lens 40 and exposed with radiation each time the workpiece trajectory crosses a point where the projection lens is aligned relative to a previously exposed exposure field EF or some other reference (e.g., the edges of the workpiece). This results in the sequential formation of to an array of adjacent exposure fields E1, E2, E3 as shown in FIGS. 5A–5C and in FIG. 6. Each exposure field EF is columnar with a long axis in the y-direction and comprises a plurality of microdevice units 500 that correspond to microdevice cells 146 on mask M. The amount of movement of workpiece stage 50 between radiation pulses is such that exposure field E2 is formed immediately adjacent exposure field E1 at side S1, and exposure field E3 is formed likewise immediately adjacent exposure field E2 at side S2, etc. Thus, the movement of workpiece W is perpendicular to the length of columnar exposure fields EF (i.e., is in the x-direction).

The speed of workpiece stage 50 during exposure of workpiece W may be limited by the temporal pulse length of radiation provided by radiation source 14, more typically the speed is determined by the maximum repetition or modulation rate of the radiation source and the distance between exposure fields. The motion of workpiece stage 50 is preferably at constant velocity, however a variable velocity due to stage accelerations and decelerations near the workpiece edge can be accommodated.

By way of example, a conventional lithography system (stepper) modified to expose a single column 140 at a time would reduce colinearity errors as compared to exposing a full field of columns at once with the same stepper. However, assuming 0.3 seconds per exposure and 20 columns 140 per exposure to produce 20,000 devices on a workpiece (wafer), then 1000 exposures are required. This would take 300 seconds per workpiece, which translates to a throughput of less than 12 substrates per hour. In contrast, using lithography system 10 in the CONTINUOUS LITHOGRAPHY™ exposure mode with a radiation source pulse rate of 100 Hz, the throughput would be increased to over 100 substrates per hour. By way of example, for a single narrow column 140 of dimension 1 mm×20 mm and a resist sensitivity of 20 mJ/cm$^2$ for image-bearing surface WS, radiation source 14 needs to provide about 8 mJ/pulse and an average power of 0.8 Watts, which is well within the range of most commercial excimer lasers. Thus, the CONTINUOUS LITHOGRAPHY™ exposure mode is preferred over the step-and-repeat exposure mode where cost-of-ownership considerations based on throughput are a significant factor in the manufacturing process. Thus to obtain the co-linearity advantages inherent is a single column exposure system, optimum advantage can be gained by confining the illumination to a single column, thus reducing the source power and by operating in a CONTINUOUS LITHOGRAPHY™ mode to improve throughput.

Figure 6:
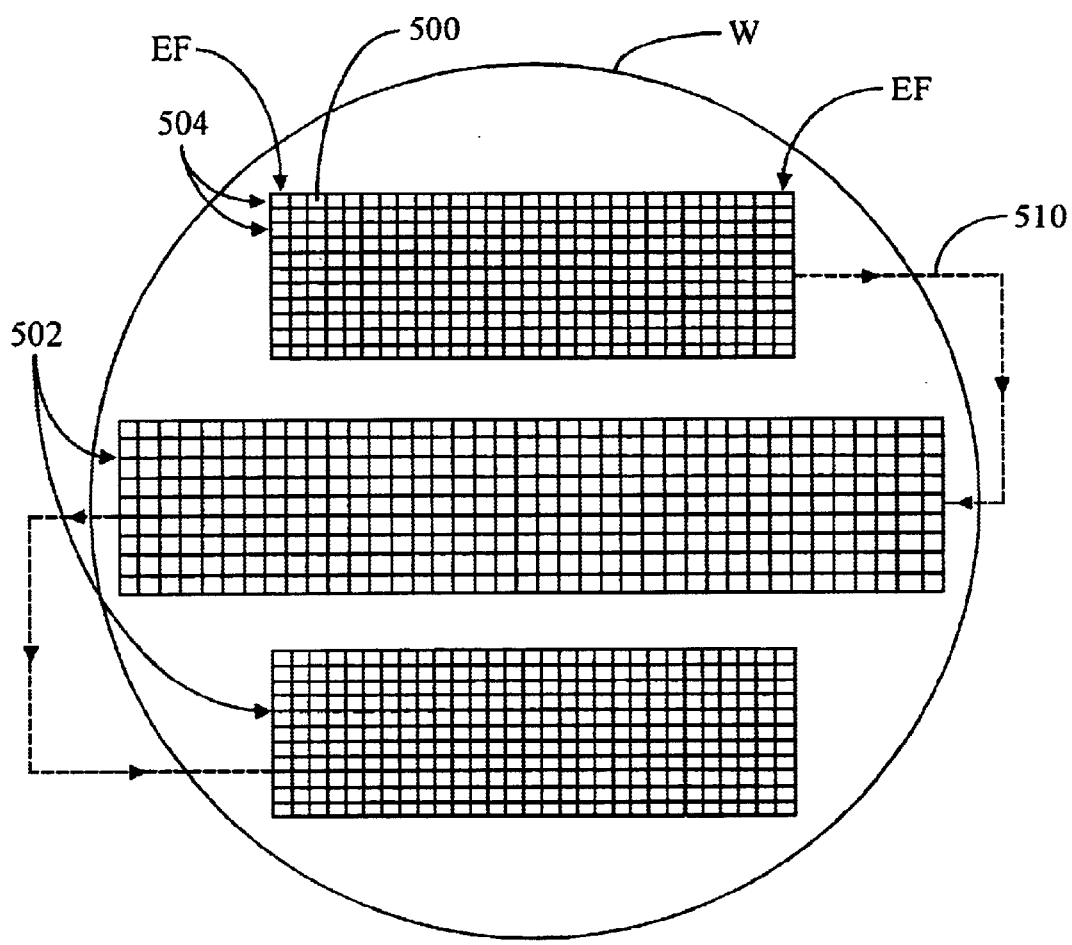
FIG. 6 is a plan view of a workpiece patterned with columnar exposure fields to form row-bars that have reduced colinearity errors, with each row-bar comprising a plurality of microdevice units.

With reference to FIG. 6, patterning workpiece W with exposure fields EF exposed one at a time and adjacent one another results in the formation of a plurality of row bar sections 502 each having a plurality of row-bars 504, with each row bar containing a plurality of microdevice units 500. The number of row bars 504 and the number of microdevice units 500 in each row bar depends on the size of workpiece W and the size of microdevice units 500. An exemplary scan path 510 for forming row-bar sections 502 is shown as a dashed line. Once a row-bar section 502 is complete, scan path 510 is designed to increment the y-position of workpiece stage 50 by at least the length of columnar exposure field EF so that a new row-bar section 502 can be printed without overlapping other row-bar sections.

With reference again to FIG. 4 and flow diagram 300, once a workpiece is fully exposed with a desired number of columnar exposure fields EF, then in step 307, system controller 90 sends an electronic signal to workpiece handling system 80 to remove workpiece W from workpiece stage 50 and replace the workpiece with another workpiece from workpiece storage unit 84. Query step 308 then asks whether another workpiece should be exposed. If the answer is "yes," then steps 302–307 are repeated for the new workpiece and subsequent workpieces until a desired number of workpieces have been processed.

Figure 7:
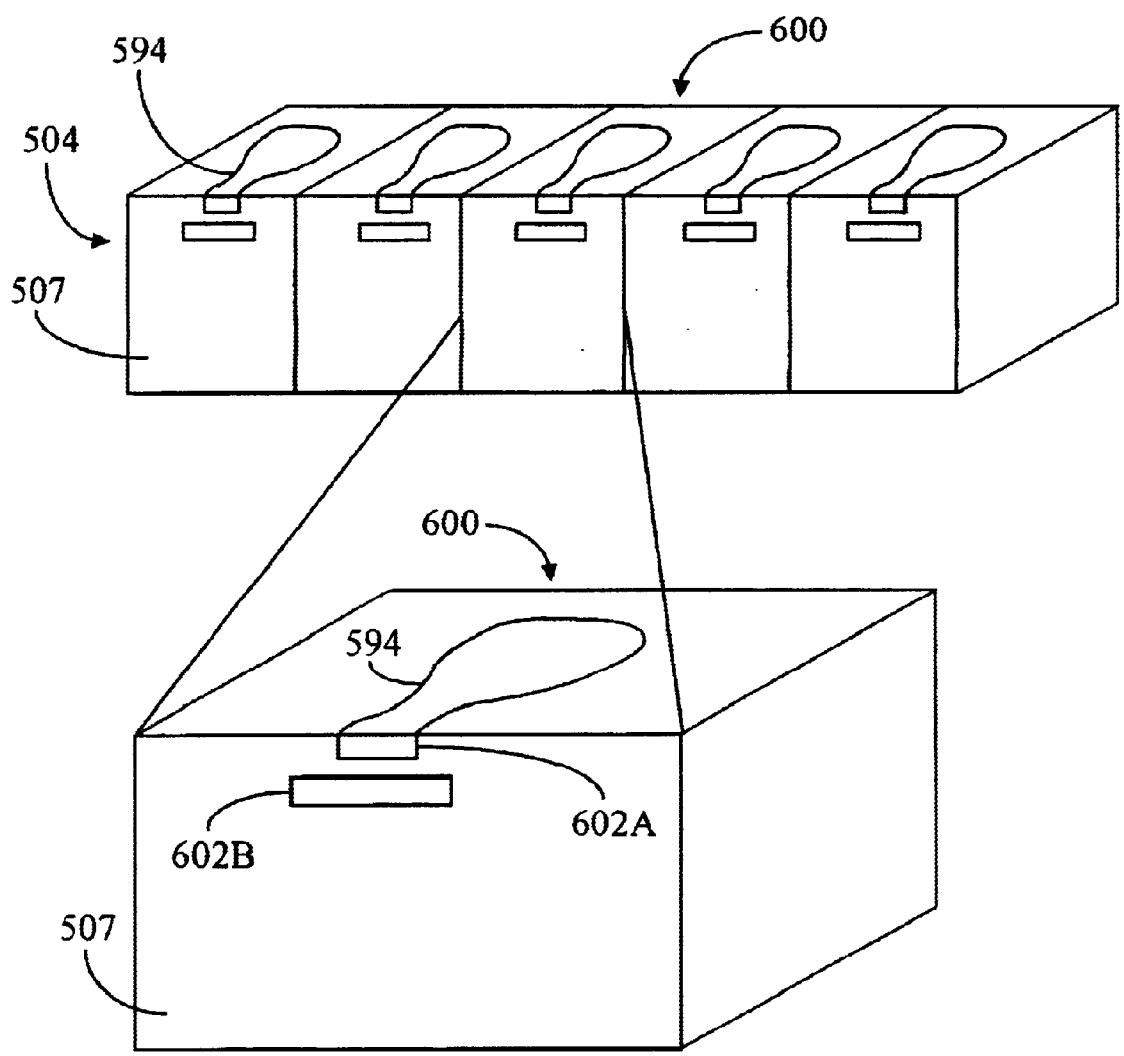
FIG. 7 is a schematic perspective diagram of a row-bar divided up into microdevice units, and showing a single microdevice unit from the row bar that is processed to form a thin-film read/write head microdevice unit.

With reference also to FIG. 7, in step 309, the workpieces are post-processed, which includes dicing the workpiece into separate row bars 504, and lapping each row bar along edge 507, which determines the position (length) of the throat 594 of the final microdevice 600. Device 600 may be a thin-film magnetic read/write head with upper pole 602A and lower pole 602B, wherein edge 507 becomes the air-bearing surface.

Step-and-repeat Exposure Mode

In addition to the CONTINUOUS LITHOGRAPHY™ mode of operation, a conventional step-and-repeat mode of operation can be used to carry out the present invention. The step-and-repeat mode of operation is similar to that of the single-pulse mode described above, with the following exceptions. With reference to flow diagram 300 of FIG. 4, in step 304 system controller 90 sends an electrical signal to stage position control system 60 to move workpiece stage 50 underneath projection lens 40 in increments or "steps." In combination therewith, in step 305 system controller 90 sends an electronic signal to radiation source controller 16, which activates radiation source 14 via an electronic signal. Radiation source 14 then provides a burst of pulses of radiation or a single relatively long pulse having a predetermined amount of energy along axis A1 so that the entire burst of radiation has sufficient energy to properly expose image-bearing surface WS of workpiece W. In this mode of operation, a burst of radiation pulses might typically includes 100 or more pulses or a tenth of a second exposure from a continuous source. In a preferred embodiment, workpiece stage 50 is stepped (i.e., moved and then stopped) between exposures. Also, single-pulse exposures can be used in combination with the step-and-repeat mode of operation. Though the step-and-repeat mode of operation has a relatively low throughput, it may be preferred in cases where the exposure dose is beyond the capability of a pulsed radiation source to generate a single pulse.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and described herein. Accordingly, other embodiments are within the scope appended claims.

What is claimed is:

1. A method of fabricating microdevices on a workpiece, comprising the steps of:

illuminating a single column of microdevice cells on a mask with pulses of radiation;

continuously moving the workpiece in a direction perpendicular to a long axis of the column of microdevice cells on the mask during illumination of the mask; and coordinating the movement of the workpiece with the timing of the pulses of radiation to pattern the workpiece with images of the illuminated single column of microdevice cells on the mask to form corresponding adjacent columnar exposure fields on the workpiece with each columnar exposure field on the workpiece formed by a single pulse of radiation.

2. The method according to claim 1, further including the step of collecting with a projection lens the portion of the pulses of radiation transmitted by the single column of microdevice cells on the mask to be imaged on the workpiece.

3. The method according to claim 2 further including the step of aligning the workpiece relative to an image of the mask produced by the projection lens.

4. The method according to claim 1, wherein the step of illuminating the mask with pulses of radiation includes the step of providing the radiation from a pulsed radiation source or a modulated continuous-wave radiation source.

5. The method according to claim 2, wherein the mask has a first width and the single column of microdevice cells on the mask has a second width that is 10% or less than the first width.

6. The method according to claim 1, wherein the mask contains a single column of microdevice cells.

7. The method of claim 1, wherein:

the mask contains multiple columns of microdevice cells; and the step of illuminating the mask further includes the step of adjusting illumination to illuminate only a single column of microdevice cells.

8. The method of claim 7, wherein the step of adjusting illumination further includes the step of adjusting an illumination field aperture to illuminate only a single column of microdevice cells.

9. The method according to claim 1, wherein each of the exposure fields has a width-to-length aspect ratio of between about 1:10 and 1:50.

10. The method according to claim 1, wherein each of the microdevices is a thin-film read/write head.

11. The method according to claim 1, further includes the step of stepping the workpiece in a direction parallel to the direction of a columnar exposure field by at least a columnar exposure field length to form multiple rows of columnar exposure fields.

12. The method according to claim 1, wherein each of the microdevice cells includes an electrical test structure to assist in controlling a lapping operation.

13. The method according to claim 12, wherein:

each of the microdevices is a thin-film head with a throat; and the method further includes the step of lapping the microdevices to define a length of a throat thereof.

14. A method of patterning a workpiece with a lithographic system to form microdevices on the workpiece in a manner that reduces colinearity effects, comprising the steps of:

supporting a mask having at least one column of microdevice cells formed thereon;

illuminating one of the at least one column on the mask with pulses of radiation;

collecting the radiation transmitted by the illuminated column on the mask with a projection lens; and exposing a single columnar exposure field with each of the pulses of radiation as the workpiece is moved continuously at a speed coordinated with the radiation pulses over a scan path normal to the direction of the column of microdevice cells on the mask to form a row of adjacent single columnar exposure fields on the workpiece.

15. The method of claim 14, wherein in the exposing step each single columnar exposure field is formed by a projection lens with the single columnar exposure field having a width of about 10% or less than the maximum field width capability of the projection lens.

16. The method according to claim 14, wherein the at least one column on the mask has a width-to-length aspect ratio in the range of about 1:10 to about 1:50.

17. The method of claim 14, wherein:

the mask contains multiple columns of microdevice cells; and the illuminating step includes the step of adjusting illumination to illuminate only a single column of microdevice cells.

18. The method according to claim 17, wherein the step of adjusting illumination includes the step of adjusting an illumination field stop.

19. The method according to claim 17, wherein the step of adjusting illumination includes the step of concentrating the illumination into the desired long, narrow area occupied by a single column of devices on the workpiece.

20. A method of patterning a workpiece with a lithographic system to form microdevices on the workpiece in a manner that reduces colinearity effects, comprising the steps of:
   supporting a mask having at least one column of microdevice cells formed thereon;
   illuminating one of the at least one column on the mask with pulses of radiation;
   collecting the radiation transmitted by the illuminated column on the mask with a projection lens;
   forming a single columnar exposure field on the workpiece with one pulse of radiation; and
   forming a row of adjacent single columnar exposure fields by stepping the workpiece by a width of a microcircuit device pattern between exposures.

21. The method according to claim 20, wherein the mask has a first width and a single column of microdevice cells has a second width that is about 10% or less of the first width.

22. The method according to claim 20, further includes the step of slicing the workpiece to form row-bars of microdevice units that contain a single device from many successive columns.

23. A system to pattern a workpiece to form microdevices on the workpiece in a manner that reduces colinearity effects, comprising:
   a radiation source to provide pulses of radiation;
   a radiation source controller in operation communication with said radiation source to control the emission of the radiation pulses from said radiation source;
   an illuminator arranged to receive pulses of radiation from said radiation source and illuminate a single column of microdevice cells on a mask;
   a projection lens arranged to receive pulses of radiation passing through the mask and adapted to form a columnar exposure field of microdevice units on the workpiece that correspond to the column of microdevice cells on the mask;
   a workpiece stage capable to support and move the workpiece over a scan path relative to the projection lens and in a direction normal to the projected direction of the columnar exposure field on the workpiece; and
   a workpiece stage position control unit in operable communication with said workpiece stage and in communication with the radiation source control unit, to control the movement of said workpiece stage over said scan path such that a single pulse of radiation a single columnar exposure field on the workpiece, with each temporally adjacent radiation pulse sequentially forming another adjacent columnar exposure field.

24. The system according to claim 23, wherein the illuminator has an associated illumination field, and the width of the column of microdevice cells is about 10% or less than the length of the column.

25. The system according to claim 23, wherein the workspace stage is a magnetically levitated stage.

26. The system according to claim 23, wherein the workpiece stage is an bearing stage.

27. The system according to claim 23, further including a pulse stabilization system arranged downstream of said radiation source.

* * * * *